United States Patent

[11] 3,590,338

[72] Inventor John S. Roberts
Export, Pa.

[21] Appl. No. 880,842
[22] Filed Nov. 28, 1969
[45] Patented June 29, 1971

[73] Assignee Westinghouse Electric Corporation
Pittsburgh, Pa.

[54] LIGHT ACTIVATED SEMICONDUCTOR DEVICE
10 Claims, 4 Drawing Figs.

[52] U.S. Cl. .......... 317/234 R, 317/235 R, 317/235 AB, 317/234 P, 317/235 N
[51] Int. Cl. .......... H01l 15/00
[50] Field of Search .......... 317/234 R, 235 R, 235 N, 235 M, 234 P, 235 AB

[56] References Cited

UNITED STATES PATENTS

| | | | |
|---|---|---|---|
| 3,396,316 | 8/1968 | Wislocky | 317/234 |
| 3,296,506 | 1/1967 | Steinmetz | 317/234 |
| 3,435,304 | 3/1969 | Bezouska | 317/234 |
| 3,450,962 | 6/1969 | Ferree | 317/235 |
| 3,474,302 | 10/1969 | Blundell | 317/234 |
| 3,504,238 | 3/1970 | Carter | 317/234 |
| 3,501,680 | 3/1970 | Martin | 317/234 |
| 3,512,249 | 5/1970 | Lewis | 29/588 |
| 3,492,545 | 1/1970 | Meyerhoff | 317/234 |

*Primary Examiner*—John W. Huckert
*Assistant Examiner*—Martin H. Edlow
*Attorneys*—F. Shapoe and C. L. Menzemer

ABSTRACT: This disclosure relates to a new and novel encapsulating package for a light-activated or light-sensitive semiconductor device. The various problems associated with introducing light through the top or cap of the encapsulating case especially the establishment of a hermetic seal are overcome by introducing light through an aperture in the base member of the case and establishing a hermetic seal by employing a soft silver layer which is disposed on the surface of the base member in contact with the semiconductor wafer.

PATENTED JUN 29 1971 3,590,338

WITNESSES:

Bernard R. Gieguez

Leon M. Garman

INVENTOR
John S. Roberts

BY
C. L. Menzemer
ATTORNEY

LIGHT ACTIVATED SEMICONDUCTOR DEVICE

BACKGROUND OF THE INVENTION

1. Field of the Invention

This invention is in the field of light-activated or light-sensitive semiconductor devices and relates particularly to encapsulating cases for such devices and a method of introducing light into such cases.

2. Description of the Prior Art

A typical prior art light-activated semiconductor device 10 is shown in FIG. 1. The device consists of a semiconductor element 12 enclosed within a case 14 which consists of a base 16 and a cap 18.

The semiconductor element consists of a wafer of semiconductor material 20, preferably silicon and metal electrical contacts 22 and 24. The wafer 20 may have two or more adjacent regions of opposite-type conductivity depending on if the device 10 is a diode, transistor, or four or more region switch. For the purpose of explaining the prior art, and the present invention the wafer 12 will be considered to be a four region switch.

The two metal contacts 22 and 24 are soft-soldered to the two emitter regions of the wafer 20.

The metal electrical contact 22 is in turn soft-soldered to top surface 26 of flat portion 28 of the base 16. The base 16 also has a stud portion 30 which extends downward from bottom surface 32 of flat portion 28.

The cap portion 18 of the case 14 is welded to the periphery of the top surface 26 of flat portion 28, of the base 16 through a steel weld ring 34 and a metal member 36.

The cap 18 has an electrical insulating section 38 which electrically insulates metal top portion 38 of the cap from the base 16.

A metal cylindrical electrode 40, whose walls form an aperture which extends entirely through the aperture, has one end 44 soft-soldered by layer 46 to metal electrical contact 24. Other end 48 extends outside of the cap 18 to facilitate making electrical contact to circuit components not shown.

The aperture 42 is suitable to receive a light pipe which transmits light to a base region in the wafer 20.

Devices of this prior art type have numerous shortcomings.

When packaging light-activated power semiconductor devices, it is necessary to have electrical, thermal and optical contact with the semiconductor element.

The introduction of an aperture in the case through which light enters the encapsulation introduces a problem in hermetically sealing the device.

To isolate the active junctions of the device from the outside ambient, a hermetic seal must be formed at point 50 or 52 in FIG. 1.

A glass-to-metal seal, which is usual prior art practice, to achieve hermeticity of the encapsulation is not satisfactory for the following reasons:

1. Unless the glass is very close to the silicon surface, the light must be collinated to efficiently activate the device; 2. The addition of the glass between the light source and the surface of the device introduces two additional reflective surfaces and unless these surfaces are optically coated to reduce reflection, the amount of light reaching the device surface is cut to about 50 percent of the source intensity.

In addition, the use of soft solders limits the ability of the device to withstand repeated thermal cycling. The electrode 40 is held rigidly in place and therefore does not permit unstressed thermal cycling of the device. These factors combine to make it extremely difficult to achieve and maintain a hermetically sealed device, and the numerous solder joints are all potential sources of failure.

In addition, the necessity of having an aperture through the cap for the light pipe restricts the selection of a cap to just one type.

An object of the present invention is to provide a light-activated semiconductor device, which can be readily hermetically sealed within a case.

Another object of the present invention is to provide a light-activated semiconductor device which contains a minimum of solder joints.

A still further object of the present invention is to provide a light-activated semiconductor device which can withstand repeated thermal cycling.

Other objects will, in part, be obvious and will, in part, appear hereinafter.

SUMMARY OF THE INVENTION

In accordance with the present invention and attainment of the foregoing objects, there is provided a light-activated semiconductor device comprising a semiconductor element having at least two adjacent regions of opposite-type semiconductivity hermetically sealed within a case, said case having a cap member and a base member, said cap member being joined to said base member to provide a hermetic enclosure for said semiconductor element, the walls of said base member forming an aperture extending entirely therethrough, means for conducting light from a source outside said hermetically sealed case through said aperture to a preselected region of said semiconductor device, and a layer of silver hermetically sealing said semiconductor element to the base member.

BRIEF DESCRIPTION OF THE DRAWING

For a better understanding of the nature and objects of the invention, reference should be had to the following detailed description and drawings, in which.

DESCRIPTION OF THE PREFERRED EMBODIMENT

Figures 1, 2, 3, 4:
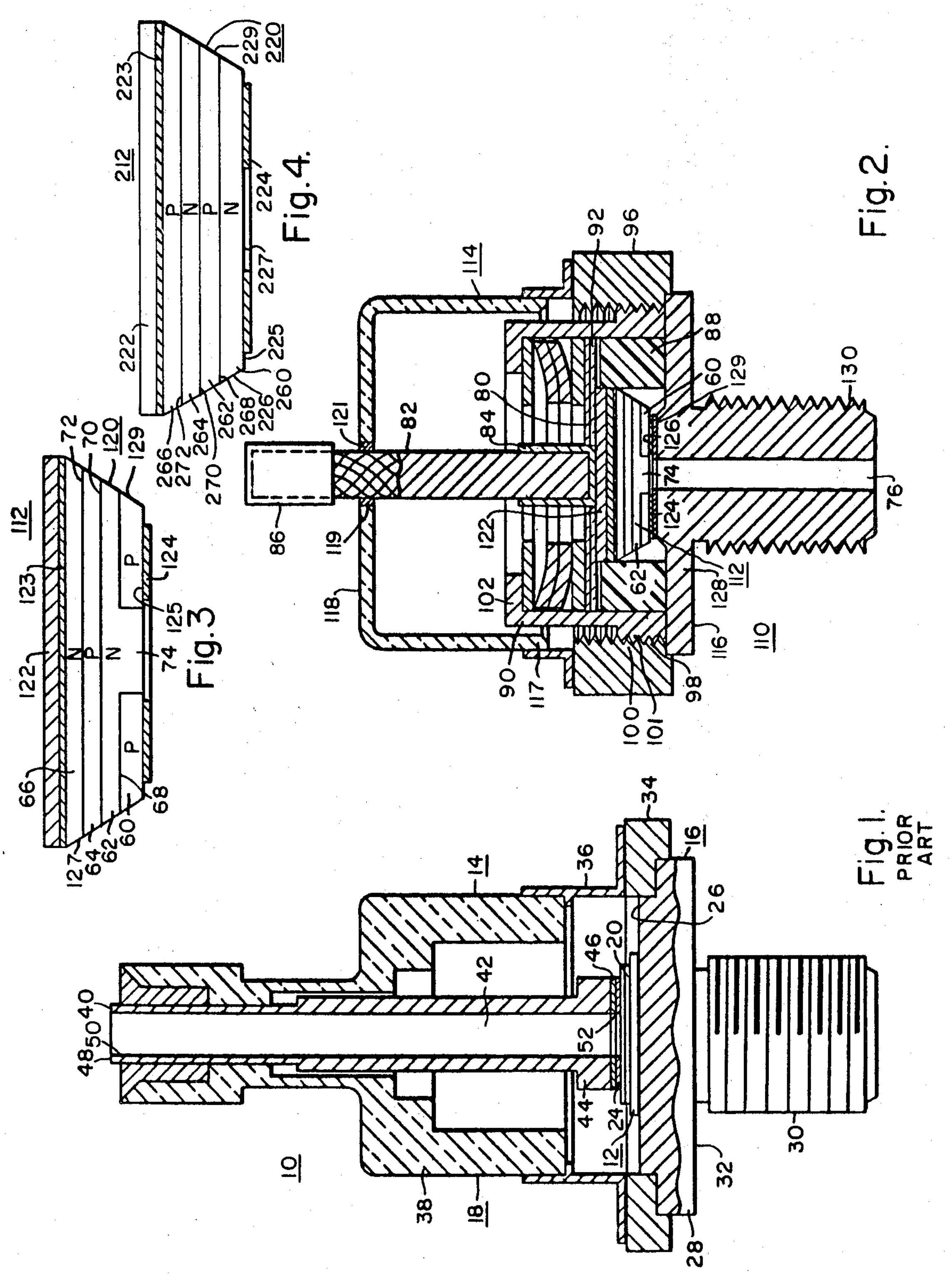
FIG. 1. PRIOR ART, FIG. 2, FIG. 3, FIG. 4
FIG. 1 is a side view in section of a prior art light-activated semiconductor device.
FIG. 2 is a side view in section of one type of a light-activated semiconductor device of this invention.
FIG. 3 is a side view of a semiconductor element suitable for use in a semiconductor device of this invention.
FIG. 4 is a side view of another semiconductor element suitable for use in accordance with the teachings of this invention.

While the invention will be described with reference to a semiconductor switch, however, the teachings of this invention are equally applicable to transistors and diodes.

With reference to FIG. 2, there is shown a semiconductor device 110 made in accordance with the teachings of this invention.

The device 110 is comprised of a semiconductor element 112 hermetically sealed within a case 114 which consists of a base 116 and a cap 118.

With reference to FIG. 3, there is shown an enlarged view of the semiconductor element 112 of this invention.

The semiconductor element 112 consists of a wafer or body 120 of semiconductor material. The element 112 has four regions 60, 62, 64 and 66 of alternate P- and N-type semiconductivity with PN junctions 68, between regions 60 and 62, 70, between regions 62 and 64 and 72, between regions 64 and 66. Regions 60 and 66 are emitter regions and regions 62 and 64 are base regions. Sidewalls 127 and 129 of the wafer 120 are tapered to reduce electrical breakdown.

It will be understood that the conductivity of the junctions may be changed so as to provide an NPNP element rather than the PNPN element shown.

A first metal electrical contact 122 selected from the group consisting of molybdenum, tungsten, tantalum and base alloys thereof is hard-soldered by a solder layer 123 to emitter region 66.

A second metal electrical contact 124 of aluminum is formed by evaporation on surface 125 of wafer 120. The contact is applied only to region 60 or if the entire surface is originally covered portion 74 of region 62 is exposed by known photoresist techniques. The aluminum contact is then sintered to the silicon, at for example 500° C. for 20 minutes, in an inert atmosphere, as for example a nitrogen atmosphere.

The thickness of the aluminum contact is important since it becomes part of the hermetic seal. Accordingly, it has been found that aluminum contact 124 must have a thickness of at least 40,000 A. to ensure a good hermetic seal.

With reference again to FIG. 2, a gold-plated silver layer 129 is brazed to flat surface 126 of flat portion 128 of the base 116.

The gold plating on silver layer 129 is only present to facilitate the brazing operation. The silver layer 129 is "dead soft" after brazing. If desired, silver layer 129 may be formed on surface 126 by evaporation and sintering.

In assembling the device of this invention, the semiconductor element 112 is disposed on the silver layer 129. Electrical contact 124 is in direct physical contact with silver layer 129. That portion 74, of region 62 that extends to the surface of the wafer between region 60 is disposed directly over an aperture 76 which extends entirely through stud portion 130 of the base 116.

Electrical contact 122 is in direct physical contact with an electrical and thermal conductive metal member 80 which in turn is joined to a copper lead 82. Copper cup members 84 and 86 are disposed on each end of copper lead 82 to facilitate joining and contacting of the lead 82.

A spacer 88 of a suitable electrical insulating material as for example, polytetrafluoroethylene and polytrifluoromonochloroethylene is disposed about the semiconductor element 112, between the element 112 and inner case member 90 to keep the element 112 in the desired position.

At least one spacer member 92 preferably of mica or the like, in the form of washers are disposed about lead 82 and are in contact with member 80.

Compression means, as for example, a plurality of Belleville Washers 94 are disposed on top of the spacer member 92.

A steel weld ring 96 is joined to flat portion 128 of the base 116. Inner wall 98 of weld ring 96 has a plurality of threads 100 thereon which engage threads 101 on the outer wall of inner case member 90.

Engaging threads 100 and 101 draws lip member 102 of the inner case member 90 against the compression means 94, and holds the aluminum electrical contact 124 in an intimate and electrical and thermal conductive relationship with silver layer 129. Electrical contact 122 is held in electrical and thermal contact with member 80 and lead 82 by the same means.

The compressive force also holds portion 74 of region 62 directly over the aperture 76 in the stud portion 130 of base member 116.

The pressure at the interface between the aluminum contact 124 and the silver layer 129, caused by engaging threads 100 and 101, should be at least approximately 2,500 p.s.i. to insure a hermetic seal between contact 124 and layer 129.

End 117 of a ceramic cap 118 is joined to the weld ring 96 and end 119 of the cap 118 is sealed about lead 82 with a glass to metal seal 121 to complete the enclosure of the semiconductor element 112 within the case.

In operation, the two emitter regions 60 and 64 of the element 112 are connected in an electrical circuit through the stud portion 130 of the base 116 and through electrical lead 82.

The device is fired by introducing light energy from any source as for example a diode, by means of a light pipe or other suitable means, through the aperture to the base region 62.

With reference to FIG. 4, there is shown an enlarged view of a second semiconductor element 212 suitable for use in accordance with the teachings of this invention.

The semiconductor element 212 consists of a wafer or body 220 of semiconductor material. The element 212 has four regions 260, 262, 264 and 266 of alternate N-type and P-type semiconductivity with PN junction 268 between regions 260 and 262, PN junction 270 between regions 262 and 264 and PN junction 272 between regions 264 and 266. N-type region 260 and P-type region 266 are emitter regions and regions 262 and 264 are base regions.

Sidewalls 227 and 229 are tapered to reduce electrical breakdown.

A first metal electrical contact 222 selected from the group consisting of molybdenum, tungsten, tantalum, and base alloys thereof is hard-soldered by a solder layer 223 to emitter region 266.

A second metal electrical contact 224 of aluminum is formed by evaporation on a portion of surface 225 of wafer 220. The contact 224 is applied only to the peripheral portion of the surface leaving exposed a central area 227.

The aluminum contact is then sintered to the silicon at for example 500° C. for 20 minutes, in an inert atmosphere. The aluminum contact 224 must have a thickness of at least 40,000 A. to ensure a good hermetic seal as described above.

The element 212 is sealed in a case member as described above with reference to FIGS. 2 and 3.

In the present element however light or radiation entering the case through the light pipe is of such a frequency that it passes through region 260 and into region 262 thereby turning the device on. A satisfactory light source is a gallium arsenide laser emitting radiation at a frequency of 9,040 A.

While a particular cap and compression bonding arrangement has been shown it is obvious that any type cap design could be used and that the compression means can be held in compressing by any means known to those skilled in the art.

I claim:

1. A light-activated semiconductor device comprising a semiconductor element, said element comprising a wafer of semiconductor material having four regions of alternate-type conductivity with a PN junction between adjacent regions formed therein, the wafer having opposed major surfaces, the end region of said wafer constituting emitter regions, the two middle regions constituting base regions, an aluminum electrical contact disposed on only a portion of one of the major surfaces, a second electrical contact affixed to the other major surface of the wafer, a case member completely surrounding said element, said case member being comprised of a base member and a cap member, said base member having a flat portion, walls of said flat portion forming an aperture therein, said aperture extending entirely through said flat portion, a layer of silver disposed on a portion of the top surface of said flat portion about said aperture, said element disposed on the flat portion the aluminum electrical contact in contact with said silver layer, the remaining portion of the major surface disposed over said aperture, the cap member of said case member disposed about said element and hermetically sealed to said base member and compression means for holding said aluminum electrical contact in intimate, electrical and thermal contact with said silver layer.

2. The device of claim 1 in which said aluminum contact is at least 40,000 A. thick.

3. The device of claim 1 in which the compressive pressure at the inner face between the aluminum contact and the silver layer is at least 2,500 p.s.i.

4. The device of claim 1 in which the base member of the case has a stud portion affixed thereto and the aperture extends entirely through said stud portion.

5. The device of claim 1 in which the silver layer is brazed to the base member about the aperture.

6. The device of claim 1 in which an electrical lead is in electrical contact with the second electrical contact and extends through said cap member.

7. A light-activated semiconductor device comprising a semiconductor element, said element comprising a wafer of semiconductor material having four regions of alternate-type conductivity with a PN junction between adjacent regions formed therein, the wafer having opposed major surfaces, the end region of said wafer constituting emitter regions, the two middle regions constituting base regions, one of said base regions having a portion extending through the adjacent emitter region and being exposed at one of the major surfaces, an aluminum electrical contact disposed only on the emitter region surrounding said portion of said base region, a second electrical contact affixed to the other major surface of the wafer, a case member completely surrounding said element, said case member being comprised of a base member and a cap member, said base member having a flat portion, walls of said flat portion forming an aperture therein, said aperture extending entirely through said flat portion, a layer of silver disposed on a portion of the top surface of said flat portion about said aperture, said element disposed in the flat portion the aluminum electrical contact on said emitter region in contact with said silver layer, the portion of said base region extending to said major surface disposed over said aperture, the cap member of said case member disposed about said element and hermetically sealed to said base member and compression means for holding said aluminum electrical contact in intimate, electrical and thermal contact with said silver layer.

8. A light-activated semiconductor device comprising a semiconductor element, said element comprising a wafer of semiconductor material having at least two regions of alternate-type conductivity with a PN junction between adjacent regions formed therein, the wafer having opposed major surfaces, an aluminum electrical contact disposed on only a portion of one of the major surfaces, a second electrical contact affixed to the other major surface of the wafer, a case member completely surrounding said element, said case member being comprised of a base member and a cap member, said base member having a flat portion, walls of said flat portion forming an aperture therein, said aperture extending entirely through said flat portion, a layer of silver disposed on a portion of the top surface of said flat portion about said aperture, said element disposed on the flat portion the aluminum electrical contact in contact with said silver layer, the remaining portion of the major surface disposed over said aperture, the cap member of said case member disposed about said element and hermetically sealed to said base member and compression means for holding said aluminum electrical contact in intimate, electrical and thermal contact with said silver layer.

9. The device of claim 8 in which the base member of the case has a stud portion affixed thereto and the aperture extends entirely through said stud portion.

10. The device of claim 8 in which the silver layer is brazed to the base member about the aperture.